United States Patent [19]
Reed et al.

[11] Patent Number: 5,995,915
[45] Date of Patent: Nov. 30, 1999

[54] METHOD AND APPARATUS FOR THE FUNCTIONAL VERIFICATION OF DIGITAL ELECTRONIC SYSTEMS

[75] Inventors: David F. Reed; Adnan A. Hamid, both of Austin, Tex.

[73] Assignee: Advanced Micro Devices, Inc., Sunnyvale, Calif.

[21] Appl. No.: 08/790,460

[22] Filed: Jan. 29, 1997

[51] Int. Cl.$^6$ .................................................. G01R 31/28
[52] U.S. Cl. ........................................ 702/119; 702/123
[58] Field of Search .................................. 702/58, 59, 81, 702/82, 117, 119, 123, 124; 364/468.16, 468.17; 371/22.5

[56] References Cited

U.S. PATENT DOCUMENTS

| | | | |
|---|---|---|---|
| 4,601,032 | 7/1986 | Robinson | 395/183.09 |
| 4,716,564 | 12/1987 | Hung et al. | 371/27.1 |
| 5,130,936 | 7/1992 | Sheppard et al. | 702/123 |
| 5,469,075 | 11/1995 | Oke et al. | 371/22.5 |
| 5,583,786 | 12/1996 | Needham | 364/488 |
| 5,617,430 | 4/1997 | Angelotti et al. | 702/117 |
| 5,684,946 | 11/1997 | Ellis et al. | 395/183.09 |

*Primary Examiner*—Marc S. Hoff
*Assistant Examiner*—Craig Steven Miller
*Attorney, Agent, or Firm*—Kevin L. Daffer; Conley, Rose & Tayon

[57] ABSTRACT

A method and apparatus capable of generating and executing large numbers of functional tests for complex digital electronic systems at low cost are presented. The apparatus includes a test generator which uses a decision tree representation of a verification space, derived from a functional specification of the digital electronic system, to generate functional tests. A decision tree representation of a verification space includes an initial goal node, a leaf goal node, and at least one intermediate goal node interconnected by a plurality of directed decision arcs formed between the initial goal node and the leaf goal node. Goal plans assigned to goal nodes include operations which generate functional tests. Functional tests are generated by recursively "walking" the decision tree, the choices of which goal node to visit next being made at random and according to decision weights assigned to each goal node. The decision weights assigned to each goal node in the decision tree may be adjusted to ensure all portions of the verification space are adequately tested. A testing system issues functional tests to both a golden device and a device under test. The testing system compares expected responses from the golden unit to responses from device under test and produces functional test results. Specialized structures called monitors ensure sets of functional tests (i.e., functional test suites) exercise all parts of a system implementation.

10 Claims, 9 Drawing Sheets

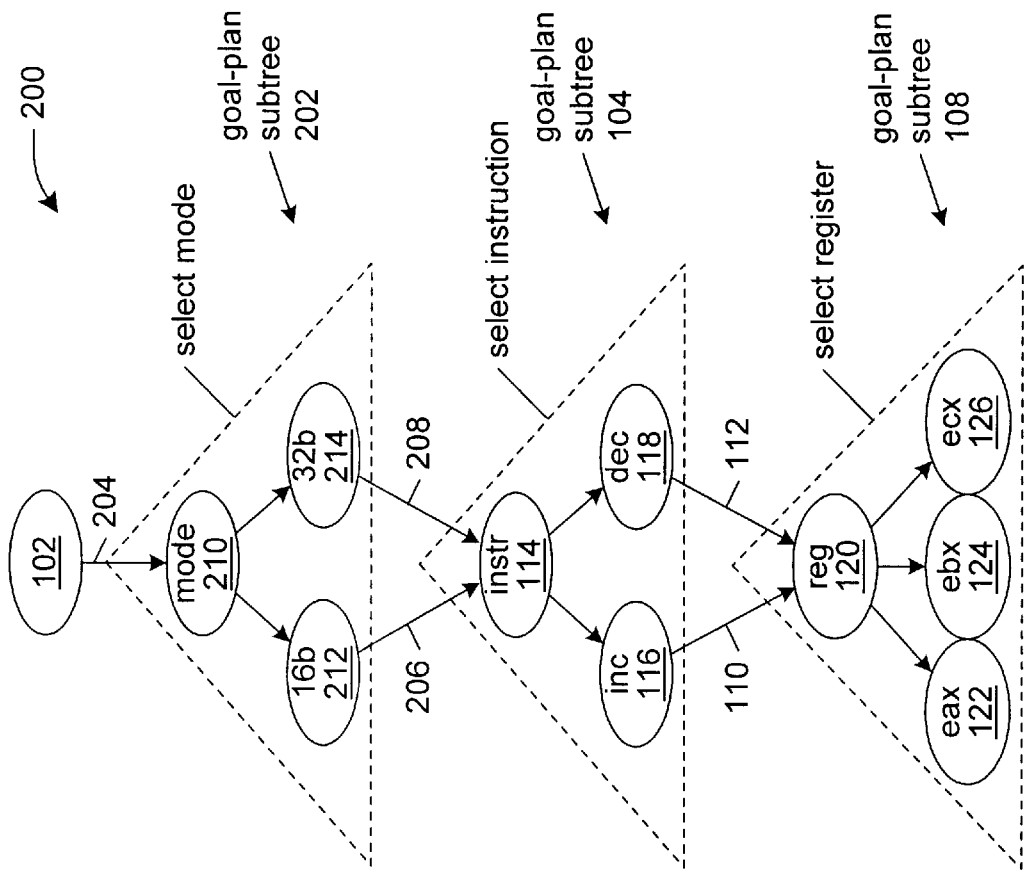

METHOD AND APPARATUS FOR THE FUNCTIONAL VERIFICATION OF DIGITAL ELECTRONIC SYSTEMS

BACKGROUND OF THE INVENTION

1. Field of the Invention

This invention relates to electronic circuits and more specifically the functional verification of digital electronic systems.

2. Description of the Relevant Art

An electronic circuit may fail to function correctly due to design errors, fabrication errors, fabrication defects, and/or physical failures. A failure to properly implement a functional specification represents a design error. Fabrication errors are attributable to human error, and include the use of incorrect components, the incorrect installation of components, and incorrect wiring. Examples of fabrication defects, which result from imperfect manufacturing processes, include conductor opens and shorts, mask alignment errors, and improper doping profiles. Physical failures occur due to wear-out and/or environmental factors. The thinning and/or breakage of fine aluminum lead wires inside integrated circuit packages due to electromigration or corrosion are examples of physical failures.

Functional verification (i.e., functional testing) is often performed to validate the correct operation of a system with respect to a set of functional specifications. Functional verification includes applying known stimuli to inputs of a system under test, recording the responses, and comparing the responses to expected responses derived from the set of functional specifications. Any deviation of recorded responses from expected responses represents a failure of a functional test.

The functional testing of a complex digital electronic system is a difficult process requiring large amounts of time and effort. Complex digital electronic systems typically contain memory elements, and have outputs which depend on past inputs as well as current inputs. Such digital electronic systems are called sequential systems, and their status at any given time is referred to as a system state. A digital electronic system with $2^M$ possible system states and $2^N$ possible input combinations would require the application of all $2^{M+N}$ possible functional tests to completely verify the correct operation of the system. Such a system has a verification space defined by all $2^{M+N}$ possible functional tests. As the number of possible system states and input combinations increases, it quickly becomes impractical to apply all of the $2^{M+N}$ possible tests required to completely verify the correct operation of a complex digital electronic system.

While there is no quantitative measure of how much of the total functional specification is verified by a set of functional tests which does not include all possible tests, confidence that a system functions correctly generally increases with the number of unique functional tests performed and passed which span all areas of the system verification space and exercise all parts of the system implementation.

Functional tests are typically derived manually by persons familiar with the system, however, and the manual generation of large numbers of functional tests for complex systems is a difficult, tedious, time consuming, and error prone process. It would thus be advantageous to provide an method and apparatus for the functional verification of digital electronic systems capable of generating and executing large numbers of functional tests for complex systems at low cost.

SUMMARY OF THE INVENTION

The problems outlined above are in large part solved by a method and apparatus for the functional verification of digital electronic systems in accordance with the present invention. Algorithmic generation of functional tests is employed in order to make the generation of large numbers of functional tests for complex systems practical. A decision tree is created from a functional specification and represents a verification space. Such a decision tree includes an initial goal node, a leaf goal node, and at least one intermediate goal node interconnected by a plurality of directed decision arcs formed between the initial goal node and the leaf goal node. Goal plans assigned to goal nodes include operations which generate functional tests. Functional tests are generated by recursively "walking" the decision tree, the choices of which goal node to visit next being made at random and according to decision weights assigned to each goal node. The decision weights assigned to each goal node in the decision tree may be adjusted to ensure all portions of the verification space are adequately tested.

The apparatus for the functional verification of digital electronic systems includes a test generator, a testing system, a golden unit, and a device under test. The test generator uses a decision tree representation of a verification space to generate functional tests as described above. The test generator provides these functional tests to the testing system as output. The testing system issues functional tests to both the golden device and the device under test. The golden device produces expected responses as output to the testing system. The device under test also produces responses as output to the testing system. The testing system compares expected responses from the golden unit to responses from device under test and produces functional test results. These functional test results flag differences in the responses from the device under test and expected responses from the golden unit as potential functional errors. The functional test results may then be screened by testing personnel to determine if differences in the responses from the device under test and expected responses from golden unit represent functional errors.

The present invention also contemplates the use of specialized structures called monitors to ensure sets of functional tests (i.e., functional test suites) exercise all parts of a system implementation. A device may be implemented in hardware or in any combination of hardware, firmware, and software. A monitor structure used to observe a hardware implementation of a device under test is called a hardware monitor. A monitor structure used to observe an implementation of a device under test which resides in software running in a hardware environment (i.e., a software implementation) is referred to as a software monitor.

Monitors also have a beneficial side effect in that they may also help to discover areas of a verification space unintentionally omitted from a decision tree representation of that verification space. An investigation based on a report from a monitor indicating that one or more functional areas of a system implementation were not fully exercised may reveal that one or more areas of a verification space were omitted from the decision tree representation.

Employing automated functional test generation and test execution, the method and apparatus of the present invention is capable of generating and executing large numbers of functional tests for complex systems at low cost.

BRIEF DESCRIPTION OF THE DRAWINGS

Other objects and advantages of the invention will become apparent upon reading the following detailed description and upon reference to the accompanying drawings in which:

FIG. 2a is a three-dimensional representation of the 12 possible operations of the simple digital microprocessor after adding a second operating mode;

FIG. 2b is a Venn diagram of the 12 possible operations of the simple digital microprocessor after adding a second operating mode;

FIG. 2c is a decision tree representation of the verification space of the simple digital microprocessor after adding a second operating mode;

Figure 1C:
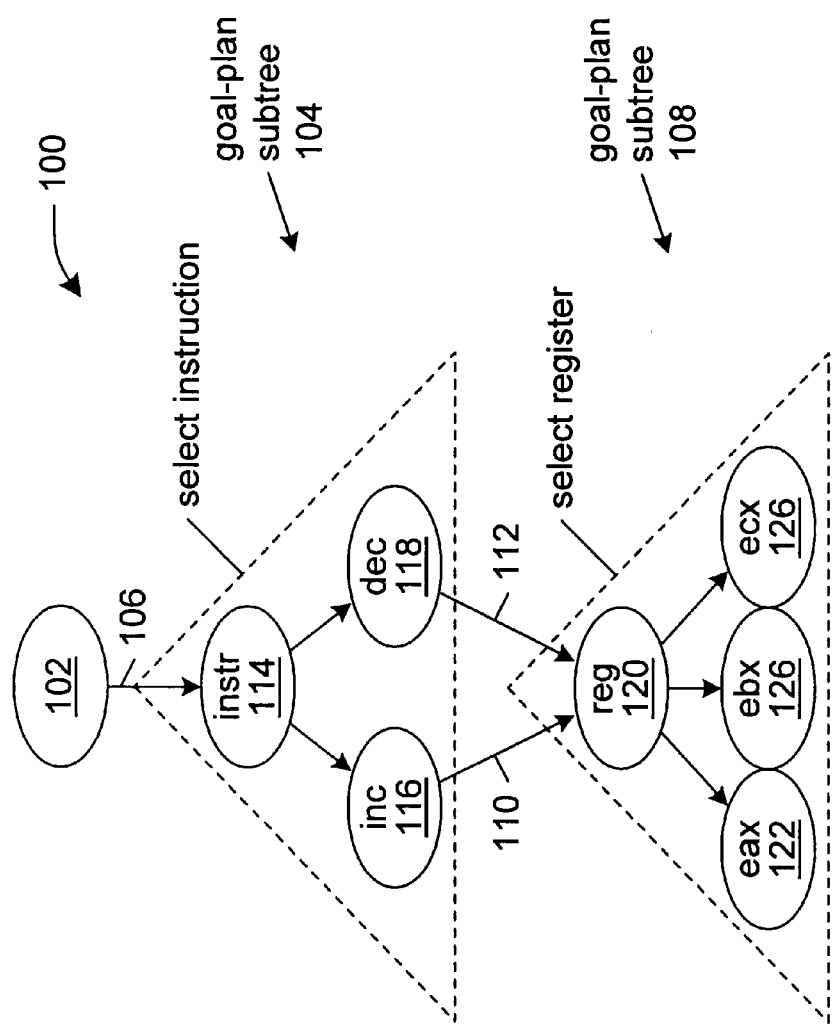
FIG. 1c is a decision tree representation of the verification space of the simple digital microprocessor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

A decision tree is a convenient graphical method of expressing, in chronological order, the alternative actions available to a decision maker. In the present invention, a decision tree consists of goal nodes connected by directed decision arcs. Directed decision arcs emanating from a given goal node represent choices which may be made by a decision maker when the goal node is encountered.

Figure 1A:
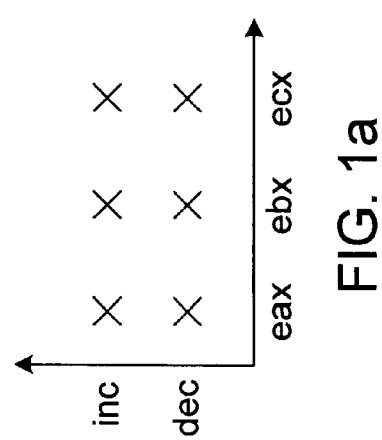
FIG. 1a is a two-dimensional representation of the six possible operations of a simple digital microprocessor.
Figure 1B:
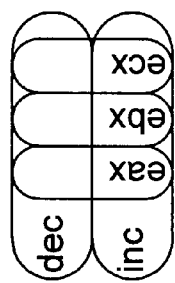
FIG. 1b is a Venn diagram of the six possible operations of the simple digital microprocessor.

For example, consider a very simple digital microprocessor which can only increment (add the number one to) or decrement (subtract the number one from) the contents of one of three registers: 'EAX', 'EBX', and 'ECX'. FIG. 1a is a two-dimensional representation of the six possible operations. FIG. 1b is also a two-dimensional representation of the six possible operations. FIG. 1b is called a Venn diagram, where each possible operation occupies a defined region of two-dimensional space.

Assume that the functional specification for the simple digital microprocessor specifies only the six operations above. Thus the verification space for the simple digital microprocessor also includes these same six possible operations. FIG. 1c is a decision tree representation of the verification space of the simple digital microprocessor which may be used to generate one or more functional tests for the simple digital microprocessor. Decision tree 100 consists of an initial goal node 102 coupled to a select instruction goal-plan subtree 104 by a directed decision arc 106. (A decision tree of the present invention has only one initial goal node, which has at least one directed decision arc emanating from it, and no directed decision arcs directed at it). Select instruction goal-plan subtree 104 is coupled to select register goal-plan subtree 108 by two directed decision arcs 110 and 112.

Select instruction goal-plan subtree 104 consists of three intermediate goal nodes 114, 116, and 118. (In a decision tree of the present invention, an intermediate goal node has at least one directed decision arc directed at it and at least one directed decision arc emanating from it). Select register goal-plan subtree 108 consists of one intermediate goal node 120 and three leaf goal nodes 122, 124, and 126. (In a decision tree of the present invention, a leaf goal node has at least one directed decision arc directed at it and no directed decision arcs emanating from it).

Once a decision tree is generated, each goal node is assigned a goal plan. A goal plan includes one or more operations which must be performed in the order prescribed in order to accomplish a particular goal. In addition, intermediate and leaf goal nodes are assigned decision weights used during decision-making operations.

A functional test is generated from a decision tree by executing the goal plan assigned to the initial goal node. At least one operation of the goal plan assigned to the initial goal involves the execution of the goal plan assigned to a goal node directed to by a decision arc emanating from the initial goal node. Goal plans assigned to goal nodes in the decision tree contain operations which generate functional tests. Functional tests may be generated manually, or with the aid of a computer.

The following section describes an algorithmic approach to functional test generation which may be programmed to run on a computer. In such a routine, a global array of characters called 'code_block' contains functional tests generated. Each row of array code_block represents an instruction line containing an instruction which may be executed by the simple digital microprocessor under test. FIG. 1d illustrates code_block structure 128. A variable called 'code_ptr' 130 contains the address of the next empty instruction line (i.e., row) in global array code_block. When code_ptr is initialized, the address of the first (empty) line in code_block is stored in code_ptr. Thus code_ptr points to (i.e., contains the address of) the first line of code_block as shown in FIG. 1d.

In the embodiment described above with a single code_block structure 128 as shown in FIG. 1d, each row of array code_block contains an instruction which may be executed by the simple digital microprocessor under test. Alternately, the code_block structure may contain both instructions and pointers to one or more sub_code_block structures. Sub_code_block structures may contain instructions which represent portions of functional tests generated. The embodiment with a single code_block structure 128 as shown in FIG. 1d is described below in greater detail.

The first step in the generation of a functional test is to execute the goal plan assigned to the initial goal node. As will be described in detail below, goal plans assigned to goal nodes in the decision tree are responsible for adding instruction lines to global structure code_block, thus creating one or more functional tests.

Let the goal plan assigned to initial goal node 102 include the following operations:

1) Repeat the following steps 2 and 3 for the number of functional test to be generated:

2) Choose a goal node directed to by a directed decision arc emanating from the current goal node at random and according to the decision weights assigned to all goal nodes directed to by directed decision arcs emanating from the current goal node, 3) Pass the address of code_ptr to the chosen node (so that the value of code_ptr may be changed) and invoke the execution of the goal plan assigned to the chosen goal node, and 4) Output the contents of global structure code_block.

Assume that only one functional test is to be generated. Thus steps 2 and 3 will be executed only once. At step 2, initial goal node 102 has but one directed decision arc emanating from it, and this directed decision arc is directed to intermediate goal node 114. Thus intermediate goal node 114 will be chosen during step 2 of the goal plan assigned to initial goal node 102 (regardless of the decision weight assigned to intermediate goal node 114). Step 3 of the goal plan of initial goal node 102 calls for invoking the execution of the goal plan assigned to chosen goal node 114.

At this point, execution of the goal plan assigned to initial goal node 102 is temporarily suspended until the goal plan assigned to goal node 114 is accomplished. After the goal plan assigned to goal node 114 is completed, execution of the goal plan assigned to goal node 102 will resume with step 4 (since only one functional test is to be generated).

Intermediate goal node 114 is the top goal node in select instruction goal-plan subtree 104, and is associated with the selection of one of the two possible instructions: increment ('INC') and decrement ('DEC'). Let the goal plan assigned to intermediate goal node 114 include the following steps:

1) Choose a goal node directed to by a directed decision arc emanating from the current goal node at random and according to the decision weights assigned to all goal nodes directed to by directed decision arcs emanating from the current goal node, and 2) Pass the address of code_ptr to the chosen node and invoke the execution of the goal plan assigned to the chosen goal node.

Goal node 114 has two directed decision arcs emanating from it. Thus a choosing procedure is needed to accomplish step 1 of the goal plan assigned to goal node 114.

In a preferred embodiment, decision weights assigned to goal nodes have integer values greater than or equal to 1. Also, a computer software routine capable of generating a random integer between 1 and a specified integer value greater than one is available. Given the above conditions, one method of implementing a goal node choosing procedure which is random in nature and depends on decision weights assigned to each goal node is to:

1) Sum the decision weights assigned to eligible goal nodes (i.e., goal nodes directed to by decision arcs emanating from the current node):

$S_W$=sum of decision weights of all eligible goal nodes $$S_w = \sum_{i=1}^{n} W_n$$

where:
$W_i$=decision weight assigned to eligible goal node 'i' and
n=total number of eligible goal nodes, $n \geq 1$ 2) Allocate sections of the range of the random number generator (from 1 to $S_W$) to each eligible goal node depending on decision weights:
$S_m$=section of the range assigned to eligible node 'm'
$1 \leq S_1 \leq W_1$;

$$\sum_{i=1}^{m-1} W_i + 1 \leq S_m \leq \sum_{i=1}^{m} W_i, 1 < m \leq n$$

3) Use the computer software routine to select a random integer within the range of 1 to $S_W$.

4) If the random integer selected is within section $S_m$, eligible goal node 'm' is considered chosen.

Let the decision weights assigned to intermediate goal node 116 (representing the 'INC' instruction) be 1, and the decision weight assigned to intermediate goal node 118 (representing the 'DEC' instruction) be 1. At step 1 of the above choosing procedure, the sum of decision weights assigned to eligible goal nodes is 2. At step 2, $1 \leq S_1 \leq 1$, where choice 1 is intermediate goal node 116, and $2 \leq S_2 \leq 2$, where choice 2 is intermediate goal node 118.

Assume the value 2 is generated by the computer software routine at step 3 of the choosing procedure. Since the value 2 lies in the $S_2$ segment, choice 2 (intermediate goal node 118 representing the 'DEC' instruction) is considered chosen at step 4 of the choosing procedure. This action completes step 1 of the goal plan of goal node 114.

Step 2 of the goal plan of goal node 114 calls for invoking the execution of the goal plan assigned to chosen goal node 118 (representing the 'DEC' instruction). At this point, execution of the goal plan assigned to goal node 114 is temporarily suspended until the goal plan assigned to goal node 118 is accomplished. After the goal plan assigned to goal node 118 is completed, execution of the goal plan assigned to goal node 114 will also be completed.

Let the goal plan assigned to intermediate goal node 118 include the following steps:

1) Choose a goal node directed to by a directed decision arc emanating from the current goal node at random and according to the decision weights assigned to all goal nodes directed to by directed decision arcs emanating from the current goal node, 2) Pass the address of code_ptr to the chosen node and invoke the execution of the goal plan assigned to the chosen goal node, and 3) Receive a character string (i.e., register name) from the chosen goal node, 4) Append the name of the instruction associated with the current goal node (i.e., character string 'dec') to the front of the character string from the chosen goal node, and 5) Store the resulting text string (i.e., instruction line) in global structure code_block at the address contained in (i.e., pointed to by) code_ptr. 6) Update the value of code_ptr so that code_ptr contains the address of (i.e., points to) the next empty line in code_block.

Intermediate goal node 118 has but one directed decision arc emanating from it, directed decision arc 112, and this directed decision arc is directed to intermediate goal node 120. Thus intermediate goal node 120 will be chosen during step 1 of the goal plan assigned to goal node 118 (regardless of the decision weight assigned to intermediate goal node 120).

At this point, execution of the goal plan assigned to goal node 118 is temporarily suspended until the goal plan assigned to goal node 120 is accomplished. After the goal plan assigned to goal node 120 is completed, execution of the goal plan assigned to goal node 118 will resume with step 2.

Intermediate goal node 120 is the top goal node in select register goal-plan subtree 108, and is associated with the selection of one of the three possible registers: 'EAX', 'EBX', and 'ECX'. Let the goal plan assigned to intermediate goal node 120 include the following steps:

1) Choose a goal node directed to by a directed decision arc emanating from the current goal node at random and according to the decision weights assigned to all goal nodes directed to by directed decision arcs emanating from the current goal node,
2) Pass the address of code_ptr to the chosen node and invoke the execution of the goal plan assigned to the chosen goal node, and
3) Receive a character string (register name) from the chosen goal node, and
4) Return the character string (register name) from the chosen goal node to the invoking goal plan.

Directed decision arcs emanating from intermediate goal node 120 are directed at leaf goal nodes 122, 124, and 126. Let the decision weight assigned to leaf goal node 122 (representing the 'EAX' register) be 2, the decision weight assigned to leaf goal node 124 (representing the 'EBX' register) be 3, and the decision weight assigned to leaf goal node 126 (representing the 'ECX' register) be 5. At step 1 of the above choosing procedure, the sum of the decision weights of all eligible goal nodes is 10. At step 2 of the above choosing procedure, $1 \leq S_1 \leq 2$, where choice 1 is leaf goal node 122,
$3 \leq S_2 \leq 5$, where choice 2 is leaf goal node 124, and
$6 \leq S_3 \leq 10$, where choice 3 is leaf goal node 126

Assume the value 5 is selected at step 3 of the choosing procedure. Since the value 5 lies in the $S_2$ segment, choice 2 (leaf goal node 124 representing the 'EBX' register) is considered chosen at step 4 of the above choosing procedure. This action completes step 1 of the goal plan assigned to goal node 120. Step 2 of the goal plan of goal node 120 calls for the execution of the goal plan assigned to chosen goal node 124 representing the 'EBX' register.

At this point, execution of the goal plan assigned to goal node 120 is temporarily suspended until the goal plan assigned to goal node 124 is accomplished. After the goal plan assigned to goal node 124 is completed, execution of the goal plan assigned to goal node 120 will resume with step 3.

Let the goal plan of goal node 124 include the following steps:

1) Initialize register 'EBX' by storing the instruction 'mov ebx,1' in global structure code_block at the line with address contained in (i.e., pointed to by) code_ptr.
2) Update the value of code_ptr so that code_ptr now contains the address of (i.e., points to) the next empty line in code_block.
3) Return the character string 'ebx' to the invoking goal plan.

At step 1, the goal plan of leaf goal node 124 stores the instruction required to initialize the 'EBX' register of the simple digital microprocessor to 1. As shown in FIG. 1e, the instruction 'mov ebx,1' is stored in line 1 of global structure code_block. The value of code_ptr, the address of line 1 of code_block, is used to access code_block. At step 2, the value of code_ptr is changed to reflect the address of the next empty line in code_block (line 2).

At step 3 of the goal plan assigned to leaf goal node 124, the character string 'ebx' is returned to the invoking goal plan of intermediate goal node 120.

The goal plan assigned to leaf goal node 124 has now been completed, and the execution of the goal plan assigned to intermediate goal node 120 resumes at step 3. At step 4 of the goal plan assigned to goal node 120, the character string 'ebx' received from leaf goal node 124 is returned to the invoking goal plan of goal node 118.

The goal plan assigned to intermediate goal node 120 has now been completed, and the execution of the goal plan assigned to intermediate goal node 118 resumes at step 3. At step 4 of the goal plan assigned to goal node 118, the character string 'dec' is appended to the front of the character string 'ebx' received from intermediate goal node 120.

Figure 1F:
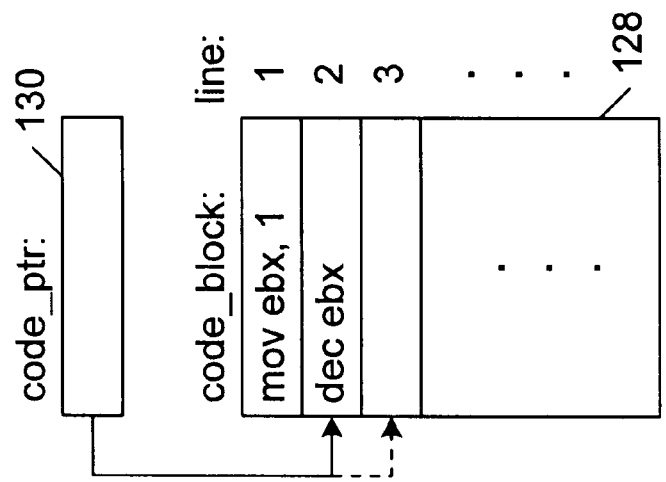
FIG. 1f shows the contents of the code block array structure after the generation of a functional test for the simple digital microprocessor.
Figure 1E:
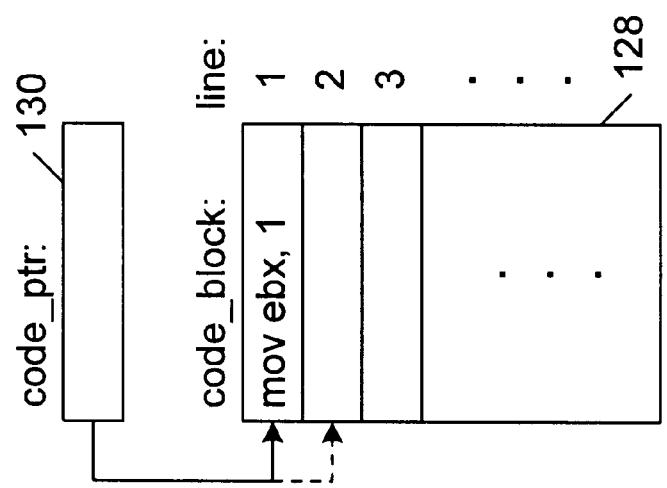
FIG. 1e shows the contents of the code block array structure after a register initialization step.
Figure 1D:
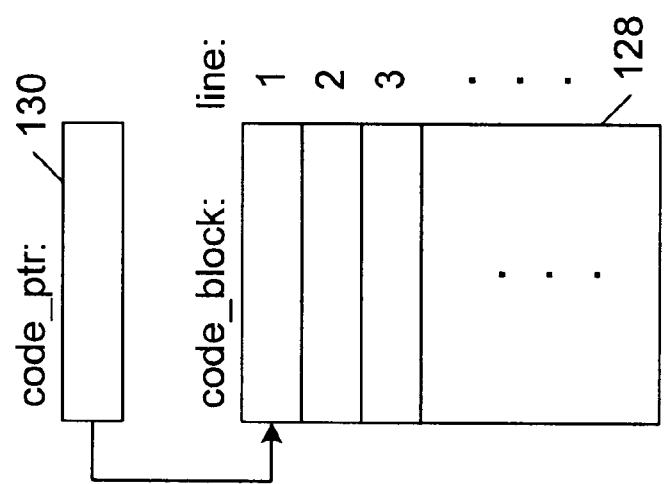
FIG. 1d is a representation of a code block array structure.

At step 5 of the goal plan assigned to intermediate goal node 118, the instruction 'dec ebx' is stored at line 2 of global structure code_block as shown in FIG. 1f. The value of code_ptr, updated by the goal plan of leaf goal node 124 to reflect the address of line 2 of code_block, is used to access code_block. At step 6, the value of code_ptr is changed to reflect the address of the next empty line in code_block (line 3).

The goal plan assigned to intermediate goal node 118 has now been completed, and the execution of the goal plan assigned to intermediate goal node 114 resumes. The goal plan assigned to intermediate node 114 is also complete, and execution of the goal plan assigned to initial goal node 102 resumes at step 4 (since only one functional test is to be generated).

At step 4 of the goal plan assigned to initial goal node 102, the contents of global structure code_block are output:

mov ebx,12
dec ebx

Thus the functional test for the simple digital microprocessor described above consists of two lines of instructions. After the above two instructions are executed, the contents of 'EBX' may be checked to verify the correct value of 0 is stored in 'EBX'.

Alternately, the goal plan of intermediate goal node 118 may be modified to generate an additional line of code to store the value of register 'EBX' at a known location in a system memory of the simple digital microprocessor for later retrieval and analysis. This is convenient when more than one functional test is to be generated, and the value stored in a given register location as a result of one functional test may be overwritten by a subsequent functional test.

In a preferred embodiment described in greater detail below, a separate testing system issues functional tests to both a golden device and a device under test. The golden device produces expected responses as output to the testing system. The device under test also produces responses as output to testing system. The testing system compares expected responses from the golden unit to responses from the device under test and produces functional test results. These functional test results flag differences in the responses from the device under test and expected responses from golden unit as potential functional errors.

In the preferred embodiment, the goal plan of intermediate goal node 118 may be modified to generate a line of code to store the value of register EBX at a known location in a system memory of the simple digital microprocessor for later retrieval and analysis. Results of subsequent tests may be stored in other locations. Such stored results may be retrieved by the testing system at a later time and compared to expected results produced by the golden device. In another approach, the goal plan of intermediate goal node 118 may be modified to generate an additional line of code to store the value of register EBX at an address associated with an input/output port coupled to the testing system. Thus the testing system may compare expected responses from the golden unit to responses from the device under test immediately after the execution of one test and prior to the execution of a subsequent test.

It is also be noted that the comparison function of the preferred embodiment allows registers to be initialized to randomly selected integer values rather than predetermined values as described above.

A second method of implementing a goal node choosing procedure which is random in nature and depends on decimal values of decision weights will now be described. Given a table of random decimal numbers ranging from 0.0 to 1.0, or access to a computer capable of generating such random decimal numbers, one method of making a random choice according to decimal decision weights assigned to all possible events is to:

1) Determine individual probabilities that a given eligible goal node will be chosen:

$P_m$=probability that eligible goal node 'm' will be chosen $$P_m = \frac{W_m}{\sum_{i=1}^{n} W_n}$$

where:

$W_m$=decision weight assigned to eligible goal node 'm' and n=total number of eligible goal nodes, $n \geq 1$ 2) Allocate sections of the range of the random number generator (from 0.0 to 1.0) to each eligible goal node depending on the probability that a given goal node will be chosen:

$S_m$=section of the range of 0.0 to 1.0 assigned to eligible node 'm'

$0.0 \leq S_1 < P_1;$ $$\sum_{i=1}^{m-1} P_i \leq S_m < \sum_{i=1}^{m} P_i, 1 < m < n;$$

$$\sum_{i=1}^{n-1} P_i \leq S_n \leq 1.0$$

3) Select a random decimal number between 0.0 and 1.0 from a table of random numbers, or have a computer capable of generating such random numbers generate a random decimal number between 0.0 and 1.0.

4) If the decimal random number selected is within section $S_m$, eligible goal node 'm' is considered chosen.

Close examination of the goal plans assigned to goal nodes in the decision tree described above reveals some obvious similarities. Note that the goal plans of initial goal node 102 and all three intermediate goal nodes 114, 118, and 120 share the following identical steps:

1) Choose a goal node directed to by a directed decision arc emanating from the current goal node at random and according to the decision weights assigned to all goal nodes directed to by directed decision arcs emanating from the current goal node, and 2) Pass the address of code_ptr to the chosen node and invoke the execution of the goal plan assigned to the chosen goal node.

Had goal plans for all leaf goal nodes 122, 124, and 126 been disclosed, they also would have shared almost identical steps:

1) Initialize register 'xxx' by storing the instruction 'mov xxx,1' in global structure code_block at the line with address contained in code_ptr.

2) Update the value of code_ptr so that code_ptr contains the address of the next empty line in code_block.

3) Return the character string 'xxx' to the invoking goal plan.

These similarities were realized and exploited in the creation of an automated implementation of the above method of generating functional tests. Modern object-oriented programming environments allow programmers to take advantage of such similarities, relieving them of the burden of having to duplicate similar blocks of computer code. This benefit becomes especially important as the size of the programming task grows.

More traditional computer programs include algorithmic computer code and passive data. A computer program in an object-oriented environment is a system of interactive objects. Objects are self-contained modules that include both data (i.e., values associated with class and instance variables) and procedures which act on data (i.e., methods). Objects take action in response to messages from other objects. Objects that have a common use are grouped together in a class, and new classes may be created that inherit the procedures and data from existing classes. Classes are organized as hierarchies, and the mechanism of inheritance automatically provides each subclass with the methods and data of parent classes. Class hierarchies and inheritance allow programmers to reuse existing computer code and data embodied in classes, and to program new subclasses with only the differences.

Let the simple digital microprocessor described above be extended to have two possible operating modes: a 16-bit operating mode and a 32-bit operating mode. FIG. 1a is a two-dimensional representation of the six possible operations. Adding a second operating mode has doubled the number of possible operations as shown in FIG. 2a. FIG. 2b is a Venn diagram assigning each of the 12 possible operations a defined region of two-dimensional space.

Assume that the functional specification for the extended simple digital microprocessor specifies only the 12 operations as shown in FIGS. 2a and 2b. Thus the verification space for the simple digital microprocessor also includes these same 12 possible operations. FIG. 2c is a decision tree representation of the verification space of the extended simple digital microprocessor which may be used to generate one or more functional tests for the extended simple digital microprocessor. Decision tree 200 consists of an initial goal node 102 coupled to a select mode goal-plan subtree 202 by a directed decision arc 204. Select mode goal-plan subtree 202 is coupled to select instruction goal-plan subtree 104 by directed decision arcs 206 and 208. As before, select instruction goal-plan subtree 104 is coupled to select register goal-plan subtree 108 by two directed decision arcs 110 and 112.

Select mode goal-plan subtree 202 consists of three intermediate goal nodes 210, 212, and 214. Select instruction goal-plan subtree 104 consists of three intermediate goal nodes 114, 116, and 118. Select register goal-plan subtree 108 consists of one intermediate goal node 120 and three leaf goal nodes 122, 124, and 126.

As before, each goal node is now assigned a goal plan. In addition, intermediate and leaf goal nodes are assigned decision weights used during decision-making operations. A functional test may now be generated from the decision tree by executing the goal plan assigned to the initial goal node.

Modern microprocessors are much more complex than either versions of the simple digital microprocessor described above. Verification space is multi-dimensional, each dimension representing instructions, addressing modes, operating modes, system configurations, etc. A functional error in a digital electronic system may be modeled as occupying some region of the multi-dimensional verification space. Certain functional errors may occupy fairly large regions, and may have correspondingly higher probabilities of being detected by a randomly-generated functional test. Other functional errors may occupy very small regions of the multi-dimensional verification space, and may have correspondingly smaller probabilities of being detected with a randomly-generated functional test. Still other functional errors may occupy regions of multi-dimensional verification space within regions occupied by other functional errors.

Figure 3:
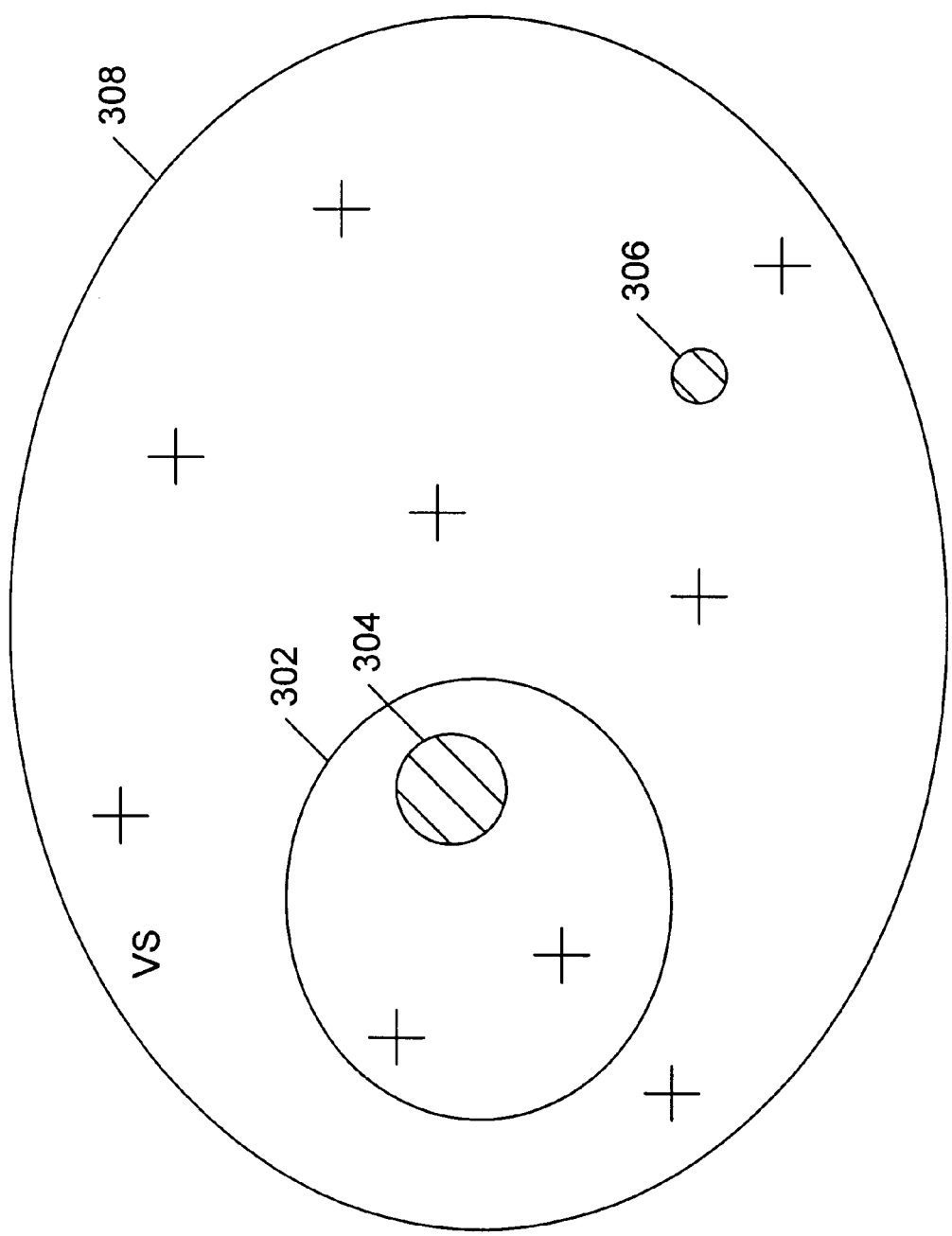
FIG. 3 is a spatial representation of functional errors within a multi-dimensional verification space.

FIG. 3 is a spatial representation of functional errors 302, 304, and 306 within an multi-dimensional verification space 308. Functional error 302 occupies a fairly large region, and may have a correspondingly higher probability of being detected by a randomly-generated functional test. Functional error 306 occupies a smaller region of multi-dimensional verification space 308, and may have a correspondingly smaller probability of being detected with a randomly-generated functional test. Functional error 304 occupies a region of multi-dimensional verification space 308 within a region occupied by functional error 302. In this case, functional error 302 may actually mask functional error 304. It may not be possible to detect functional error 304 until functional error 302 is detected, diagnosed, and eliminated.

Based on experience, the authors submit that the rate of functional error detection versus the number of functional tests performed in the debugging of a complex digital electronic system follows an equation similar to that of a Wiebull probability distribution function. The term debugging as used herein refers an operation involving the detection, diagnosis, and elimination of functional errors.

In general, the equation for the rate of functional error detection versus the number of functional tests performed is:

$$\text{rate} = an^{b} \cdot e^{-(cn^d)}$$

where n=number of functional tests performed. The values of a, b, c, and d may be determined by curve fitting to actual debugging data.

Figure 4:
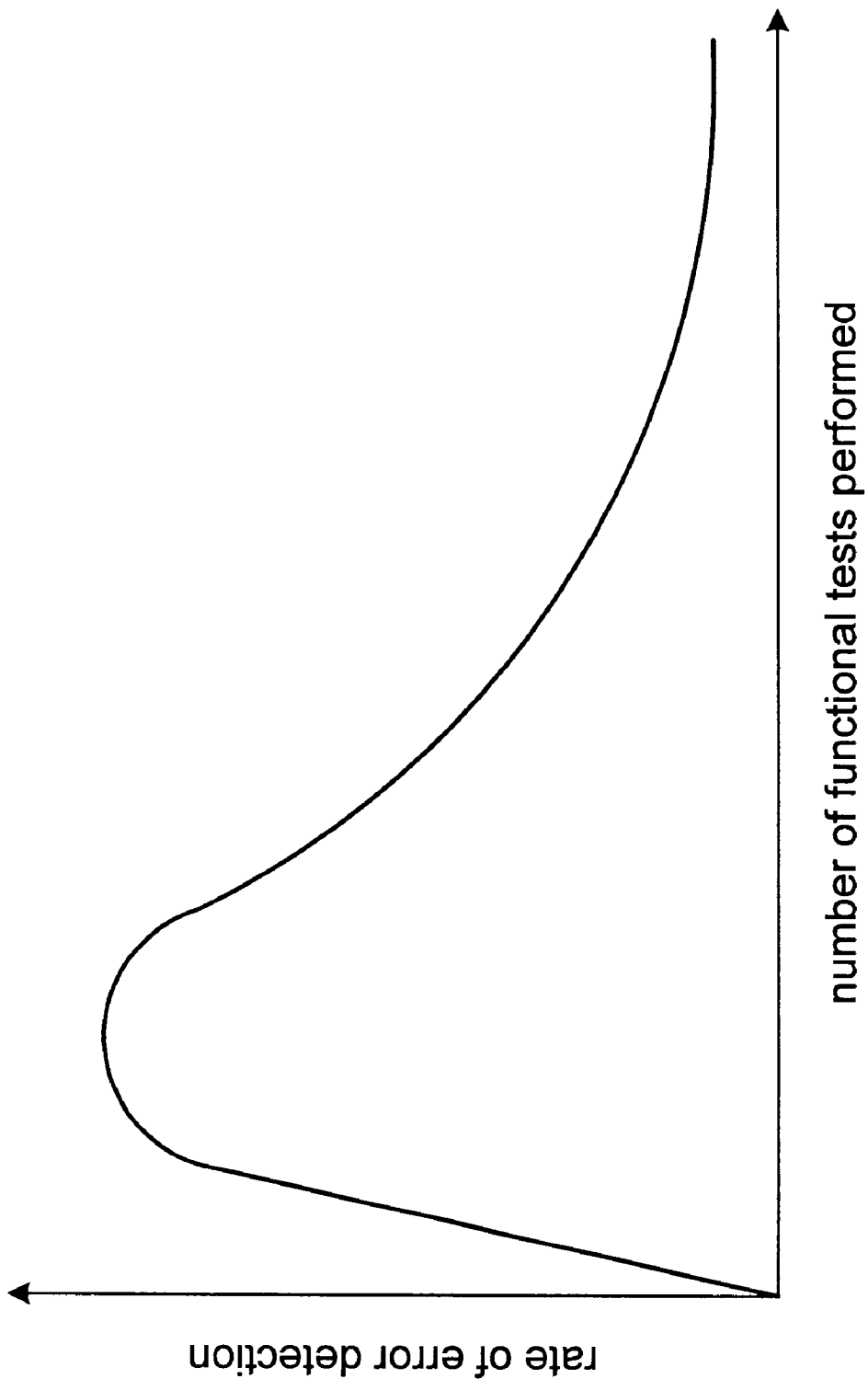
FIG. 4 is a graph of the rate of functional error detection versus the number of functional tests performed.

FIG. 4 is a graph of the rate of functional error detection versus the number of functional tests performed which conforms to the above equation. The shape of this curve may result from a rate of functional error detection that starts at zero with no functional tests performed and increases as functional errors occupying fairly large regions of the verification space are detected and eliminated, unmasking functional errors occupying smaller regions of the verification space. Functional error detection may peak when most of the functional errors occupying fairly large regions of the verification space have been detected and eliminated. The rate of functional error detection may then decrease exponentially as more functional tests must be performed to detect the remaining functional errors occupying smaller regions of verification space.

It is noted that although the performance of additional functional tests is always likely to result in the detection of functional errors, it is also likely that at some point a low functional error detection rate may not justify the costs associated with performing additional functional tests. The utility of the functional error detection rate curve is that once defining parameters are determined by curve fitting to actual debugging data, the number of functional errors likely to be detected by a given number of additional functional tests may then be calculated. This allows a decision to be made concerning when the costs associated with additional functional testing may not be justified.

Modern microprocessors are much more complex than either versions of the simple digital microprocessor described above. Due to the vast amount of software available for x86 microprocessors, they are the most popular family of digital microprocessors available today. In order to maintain compatibility with their predecessors, newer x86 microprocessors simply added instructions, addressing modes, architectural features, and operating modes to a basic x86 architecture. For example, a protected operating mode became available with the introduction of the 80286 digital microprocessor to provide memory protection in a multitasking environment. The 80286 had two operating modes; the real operating mode of the original 8086 digital microprocessor and the new protected mode.

A third virtual-8086 (i.e., virtual) operating mode became available with the introduction of the 80386 digital microprocessor. The virtual operating mode exists within the protected operating mode. A new hardware paging unit was added to support a new a memory management technique called paging. Paging may be enabled or disabled by system software. More modern x86 microprocessors also include a system management mode (SMM) which allows control over the amount of power dissipated by the microprocessor. Newer x86 microprocessors also have cache memory systems located on the same integrated circuit (i.e., chip) or within the same semiconductor device package. Such on-chip and on-package caches operate under software control, and may be operated in a write-back mode, a write-through mode, or may be disabled.

The fourteen 16-bit registers of the original 8086 digital microprocessor have been extended and expanded to the ten 32-bit registers and six 16-bit registers of modern x86 microprocessors. As a result, a modern x86 microprocessor must be capable of executing each of a large number of variable-length x86 instructions, many of which have several different possible addressing modes, while operating in any one of several possible operating modes including the real, protected, and virtual operating modes.

Figure 5:
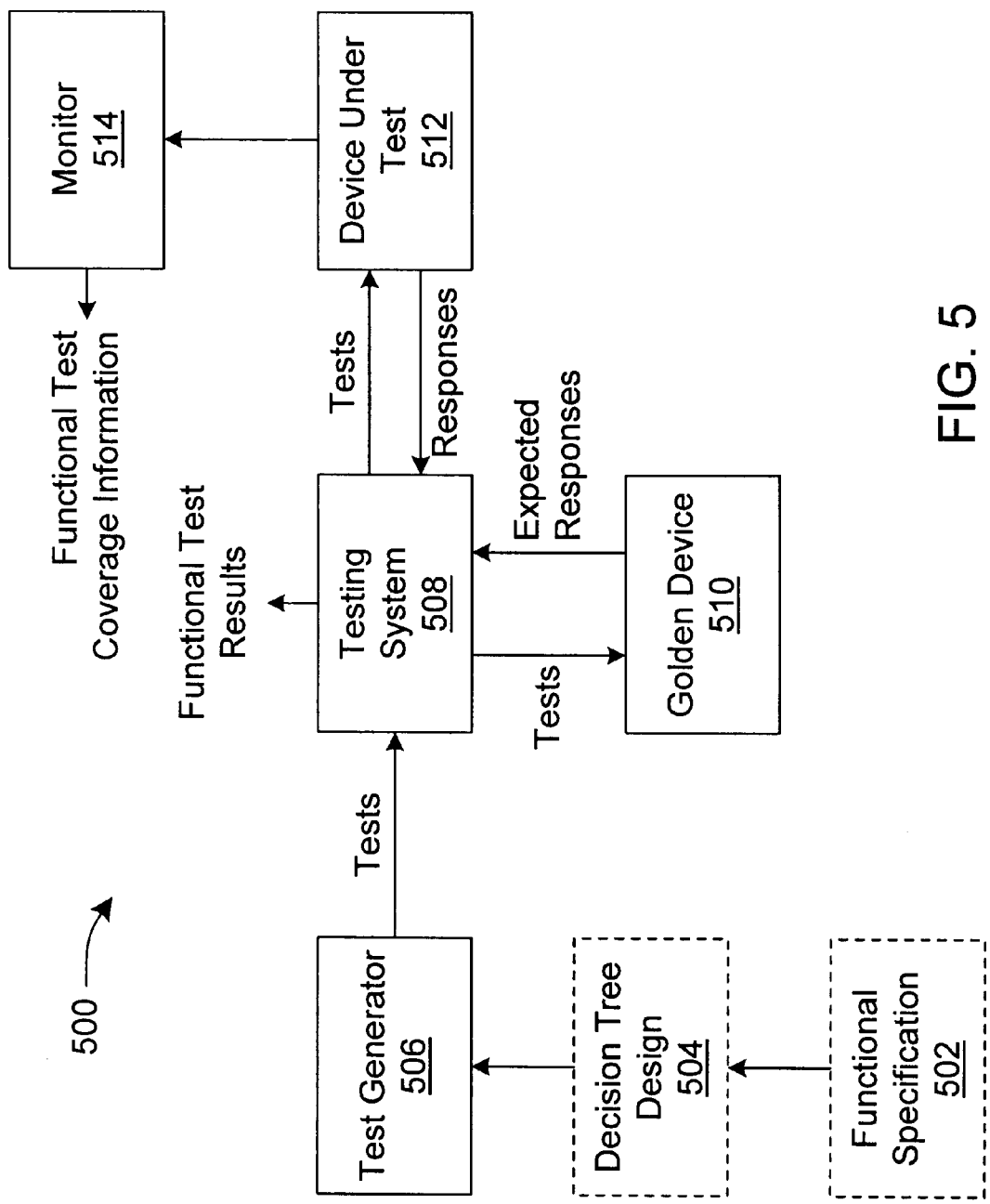
FIG. 5 is a block diagram of a functional verification apparatus in accordance with the present invention.

FIG. 5 is a block diagram of a functional verification apparatus 500 in accordance with the present invention. A functional specification 502 is used to generate a decision tree design 504. Decision tree design 504 is embodied in test generator 506 as will be described below. Test generator 506 produces one or more functional tests as output to a testing system 508. Testing system 508 is coupled to a golden device 510 and a device under test 512. Device under test 512 is coupled to a monitor 514.

As defined herein, a device may be implemented in hardware or any combination of hardware, firmware, and software.

Testing system 508 issues functional tests to both golden device 510 and device under test 512. Golden device 510 produces expected responses as output to testing system 508. Device under test 512 produces responses as output to testing system 508. Testing system 508 compares expected responses from golden unit 510 to responses from device under test 512 and produces functional test results. These functional test results flag differences in the responses from device under test 512 and expected responses from golden unit 510 as potential functional errors. The functional test results may then be screened by testing personnel to determine if differences in the responses from device under test 512 and expected responses from golden unit 510 represent functional errors.

Monitor 514 is coupled to device under test 512 and produces functional test coverage information. Functional test coverage information may include areas of functionality of device under test 512 exercised (or not exercised) during one or more functional tests. For example, functional test coverage information may include areas of a system memory of device under test 512 addressed (or not addressed), registers used (or not used), lines of microcode addressed (or not addressed), states of state machines entered (or not entered), and operating modes entered (or not entered) during one or more functional tests. Monitors are included in the functional test apparatus to ensure functional tests (i.e., functional test suites) exercise all parts of system implementations.

One embodiment of device under test 512 is a hardware implementation. A monitor structure used to observe a hardware implementation of device under test 512 also comprises hardware, and is called a hardware monitor. A hardware monitor may have an external bus structure to allow connection to one or more accessible pins, terminals, or external signal lines of a hardware implementation of device under test 512.

An alternate embodiment of device under test 512 is a software implementation which operates in a computer hardware environment. A monitor structure used to observe a software implementation of device under test 512 may also comprise software. Such a monitor is referred to as a software monitor.

Monitors also have a beneficial side effect in that they may also help to discover areas of a verification space unintentionally omitted from a decision tree representation of that verification space. For example, a failure to exercise a given functional area of device under test 512 may result from a failure to include the functional area in decision tree design 504 or the decision tree embodied in test generator 506.

Figure 6:
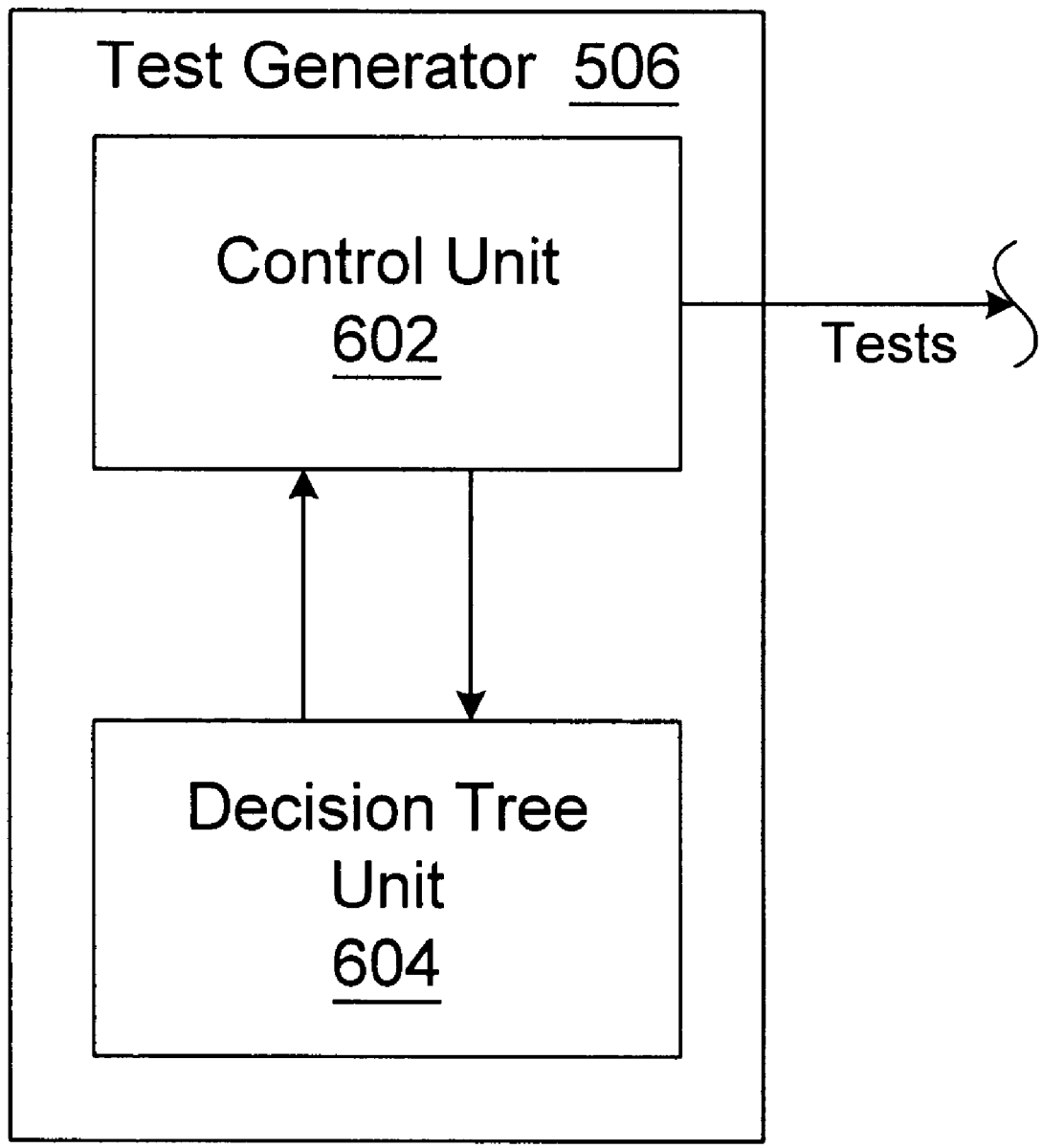
FIG. 6 is a block diagram of a test generator of the functional verification apparatus.

In the embodiment of FIG. 6, test generator 506 includes a control unit 602 and a decision tree unit 604. Control unit 602 performs functional test pre- and post-processing actions, controls the actions of decision tree unit 604, and drives the signal lines of an output port with functional tests. Functional test pre-processing actions may include initialization of golden device 510 and device under test 512. Functional test pre-processing actions may also include the initialization of a special section of a system memory of golden device 510 and device under test 512 used to store intermediate and final results of functional tests. Functional test post-processing may include the outputing of intermediate and final results of functional tests stored in a special section of a system memory of golden device 510 and device under test 512.

Decision tree unit 604 is an embodiment of a decision tree design 504. Upon instruction from control unit 602, decision tree unit 604 is capable of generating one or more functional tests.

As devices, test generator 506, control unit 602, and decision tree unit 604 may be implemented in hardware or any combination of hardware, software, and firmware. In one embodiment, test generator 506 is a computer system, and control unit 602 and decision tree unit 604 are computer software programs.

Figure 7:
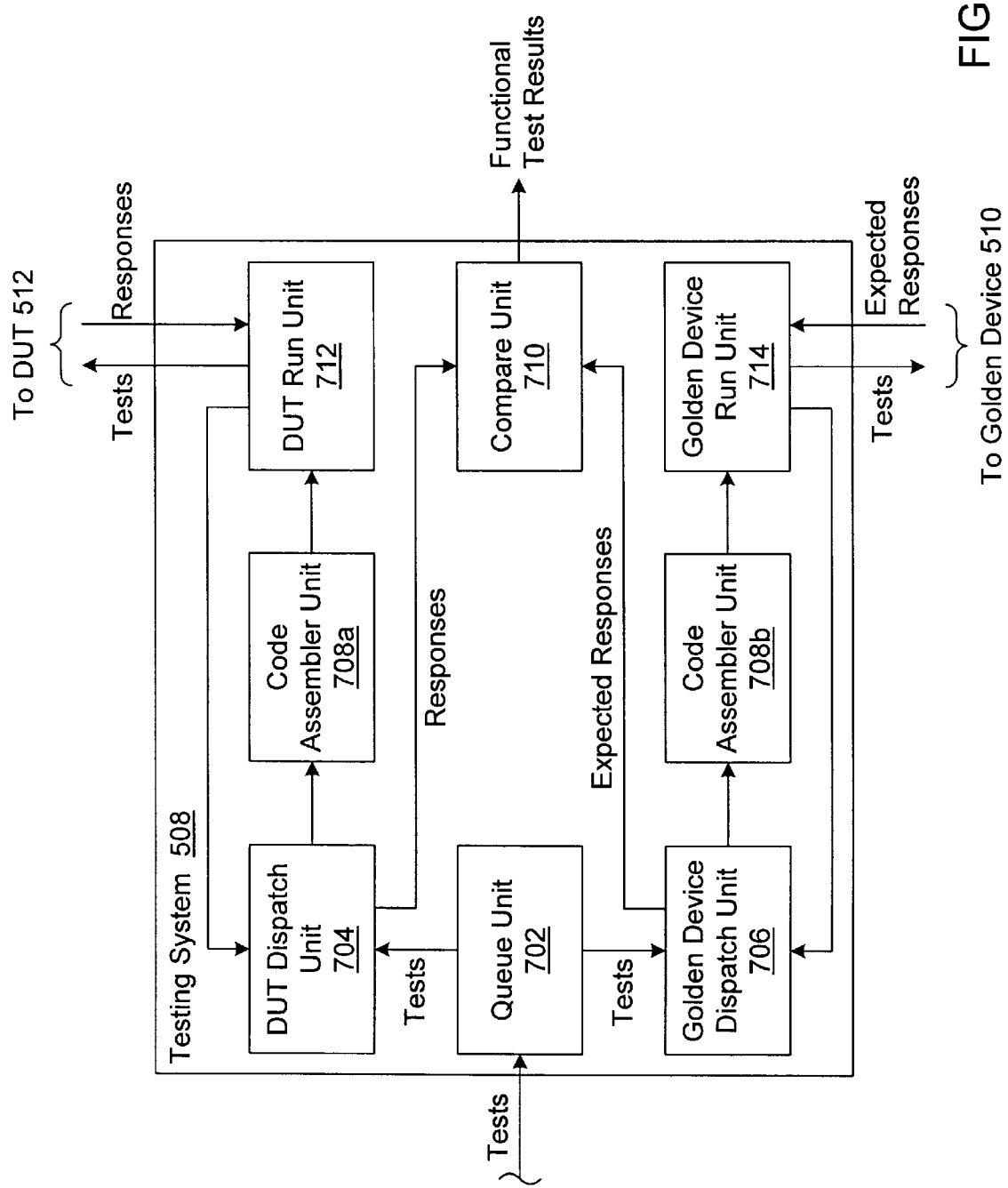
FIG. 7 is a block diagram of a testing system of the functional verification apparatus.

FIG. 7 shows one embodiment of testing system 508. A queue unit 702 is coupled to a device under test (DUT) dispatch unit 704 and a golden unit dispatch unit 706. DUT dispatch unit 704 is coupled to a code assembler unit 708a and a compare unit 710. Code assembler unit 708a is coupled to a DUT run unit 712. DUT run unit 712 is coupled to DUT dispatch unit 704 and DUT 512. Golden unit dispatch unit 706 is coupled to a code assembler unit 708b and compare unit 710. Code assembler unit 708b is coupled to a golden device run unit 714. Golden device run unit 714 is coupled to golden device dispatch unit 706 and golden device 510.

Queue unit 702 is adapted to receive functional tests generated by test generator 506. Queue unit 702 issues functional tests received from test generator 506 to DUT dispatch unit 704 and golden unit dispatch unit 706.

DUT dispatch unit 704 issues functional tests received from queue unit 702 to code assembler unit 708a. Code assembler unit 708a encodes the functional test received from DUT dispatch unit 704 into machine instructions capable of being executed by DUT 512. DUT run unit 712 issues machine instructions received from code assembler unit 708a to DUT 512, and receives response signals back from DUT 512. DUT run unit 712 sends response signals received from DUT 512 to DUT dispatch unit 704.

Golden device dispatch unit 706 issues functional tests received from queue unit 702 to code assembler unit 708b. Code assembler unit 708b encodes the functional test received from DUT dispatch unit 706 into machine instructions capable of being executed by golden device 510. Golden device run unit 714 issues machine instructions received from code assembler unit 708b to golden device 510, and receives response signals back from golden device 510. The response signals received from golden device 510 are called expected response signals. Golden device run unit 712 sends expected response signals received from golden device 510 to golden device dispatch unit 706.

In a preferred embodiment, code assembler units 708a and 708b are combined into a single code assembler unit 708 coupled to DUT dispatch unit 704, DUT run unit 712, golden device dispatch unit 706, and golden device run unit 714. Two separate code assembler units 708a and 708b are shown to improve the clarity of FIG. 7. When code assembler unit 708 receives a functional test from DUT dispatch unit 704, code assembler unit 708 decodes the functional test and issues machine instructions to DUT run unit 712. When code assembler unit 708 receives a functional test from golden device dispatch unit 706, code assembler unit 708 decodes the functional test and issues machine instructions to golden device run unit 714.

DUT dispatch unit 704 issues response signals from DUT 512 to compare unit 710. Golden device dispatch unit 706 issues expected response signals from golden device unit 510 to compare unit 710. Compare unit 710 compares the response signals from DUT 512 to expected response signals from golden device unit 510, and issues functional test results. As mentioned above, these functional test results flag differences in the responses from DUT 512 and expected responses from golden unit 510 as potential functional errors. The functional test results may then be screened by testing personnel to determine if differences in the responses from device under test 512 and expected responses from golden unit 510 represent functional errors.

The method and apparatus described above is capable of generating and executing large numbers of functional tests for complex digital electronic systems at low cost. The apparatus includes a test generator which uses a decision tree representation of a verification space, derived from a functional specification of the digital electronic system, to generate functional tests. A decision tree representation of a verification space includes an initial goal node, a leaf goal node, and at least one intermediate goal node interconnected by a plurality of directed decision arcs formed between the initial goal node and the leaf goal node. Goal plans assigned to goal nodes include operations which generate functional tests. Functional tests are generated by recursively "walking" the decision tree, the choices of which goal node to visit next being made at random and according to decision weights assigned to each goal node. The decision weights assigned to each goal node in the decision tree may be adjusted to ensure all portions of the verification space are adequately tested.

A testing system issues functional tests to both a golden device and a device under test. The testing system compares expected responses from the golden unit to responses from device under test and produces functional test results. Specialized structures called monitors ensure sets of functional tests (i.e., functional test suites) exercise all parts of a system implementation.

The following is a working example of a functional test generation engine. The functional test generation engine is a computer program specifically adapted to generate testing sequences (i.e., functional tests) for a microprocessor under test. The microprocessor under test may be, for example, an x86 microprocessor. The functional tests are used to verify the proper operation of the microprocessor. The executions of these functional tests may be monitored as described above in order to implement a functional verification system.

Complete functional testing of a modern microprocessor is made difficult by the large number of possible combinations of instructions, operating modes, and system configurations. The functional test generation engine automates the task of generating functional tests, allowing large numbers of functional tests to be generated in a relatively short period of time. The functional tests produced by the functional test generation engine include instructions which will later be executed by a microprocessor under test.

The functional test generation engine employs the novel method of generating functional tests described above. The functional tests include random valid microprocessor instructions. The functional tests are in essence computer programs which first put a microprocessor under test into a desired operating mode, then cause the microprocessor under test to perform a desired activity which produces a result. The result produced by the microprocessor under test is then compared to an expected result. If the result produced by the microprocessor under test does not match the expected response, the microprocessor under test fails the functional test.

The functional test generation engine is described using constructs of the Common LISP programming language with Common LISP Object Structure (CLOS) extensions. A description of the Common Lisp computer language with CLOS object-oriented extensions may be found in Steele, Guy L., *Common Lisp*, Digital Press, 1990.

The functional test generation engine is implemented in LISP as a goal-plan problem solver. Extensive use of slot and method inheritance allow goal hierarchies to be encoded efficiently without becoming huge coding projects. Code generation is driven by a decision tree representation of verification space, where each decision node in the tree is represented by a goal object. Each goal object may have two or more child objects which represent more specific goals which would satisfy the parent goal. If a goal object has no children, it has associated with it a plan. This plan is implemented as a method which encodes the steps necessary to achieve that goal. In order to decide on one of the possibilities at a decision node, the software recursively advances through the goal hierarchy, at each stage making a weighted random choice on which child object to go to, until a leaf object is reached. The plan method associated with that leaf object is then executed. This processes also identifies any new goals which need to be achieved in order to implement the plan. These new goals are then achieved by other plans.

While the functional test generation engine is specifically adapted to generate functional tests for microprocessors, the method of advancing through a "decision tree" which represents the universe of all possible functional tests may be applied to testing other types of microprocessors, and even electronic circuits in general.

The functional test generation engine is preferably implemented in Common LISP with Common LISP Object Structure (CLOS) extensions and within the Franz Common LISP Environment (Allegro Common LISP, Version 4.e or higher, Franz Inc., 1995 University Ave., Berkeley, Calif. 97404). The assembly language programs produced by the functional test generation engine are intended to be assembled and linked into executable functional test programs. If the microprocessor under test is an x86 microprocessor, the x86 assembly language programs preferably contain assembly directives and linker options of the Phar Lap 386 ASM Assembler (Phar Lap Software Inc., Cambridge, Mass.). The Phar Lap LinkLoc Linker is preferably used to generate executable functional test code. In addition, the Allegro Composer program is preferably employed to allow CLOS structures of the functional test generation engine to be viewed. (Allegro Composer, Franz Inc., 1995 University Ave., Berkeley, Calif. 97404). Further, a screen editor is preferably used to edit functional test generation engine source files. Suitable screen editors include the 'vi' or 'emacs' editors which run under the UNIX® operating system. (Unix® is a registered trademark of Bell Laboratories, Murray Hill, N.J.). The screen editor may be initiated before the Allegro Common LISP and Composer programs are loaded in order to allow editing of source code files and viewing of CLOS structures. After loading all required files, the functional test generation engine may be invoked within the Allegro Common LISP environment.

Functional testing is accomplished using a testing system which includes the microprocessor under test and is capable of:
1) loading an executable functional test program into a memory unit coupled to the microprocessor under test,
2) initiating execution of the functional test program, and
3) saving the computed results to a peripheral device which stores the computed results in a non-volatile form.

In the case of an x86 microprocessor under test, an x86 WBINVD (write back invalidate) instruction is preferably executed after computed results are produced in order to save any cached data to memory. The contents of memory may then be printed or otherwise saved in a non-volatile form.

The functional test generation engine uses a decision tree to capture the knowledge required to generate all possible functional tests (i.e., to cover a "verification space"). Each node in the functional test generation engine decision tree is a resource capable of providing a solution to a particular problem (i.e., a problem solver resource). The top level problem to be solved is "to generate an functional test". This problem can be solved by breaking it down into several more specific problems; for example, "generate an instruction test" or "generate a page re-map". This is analogous to the choices that can be made at a top DO-TEST node in the decision tree. Solving the "generate an instruction test" problem might involve breaking the problem into still more specific problems such as: "select an instruction", "select a valid format for that instruction", and if the format involves a memory location "generate a memory location to use in this test". Solving each of these problems is analogous to moving one decision node further down in the decision tree.

Viewing the functional test generation engine as a problem solver accurately reflects the internal software architecture implemented. Essentially, the functional test generation engine includes a software implementation of a decision tree, and is capable of generating all possible functional tests. Advancing through this decision tree involves making a number of independent decisions. Each independent decision made have a large number of associated possible choices, and may be considered a problem to be solved.

A given problem may have several possible solutions, and each solution may have something in common with all other solutions. This commonality among possible solutions makes an object hierarchy a very efficient way of encoding the possible solutions. In object-oriented programming terms, "parent" objects may be used to represent classes of solutions. These parent objects may have commonality encoded within them as methods. "Child" objects, which represent a more specific solutions, inherit the methods of their parent objects. Child objects need only redefine inherited methods as required to reflect their more specific solution.

Each object in an object hierarchy can be thought of as a resource which is able to provide a solution to a particular class of problems. Typically, when asked to provide a solution, an object will make a weighted random selection among its children, each one of which provides a more specific class of solutions. The weighting which biases the relative frequency of selection is preset by the programmer or test engineer prior to generating the functional test. This continues until we reach a "leaf" object which has no children. The leaf object is capable of providing a specific solution. Once a leaf object has been chosen, its methods are executed. The result is the code and/or data definitions required to generate the functional test. Other resource objects may also contribute to the actual generation of software instructions and data written to the functional test source code file.

Figure 8:
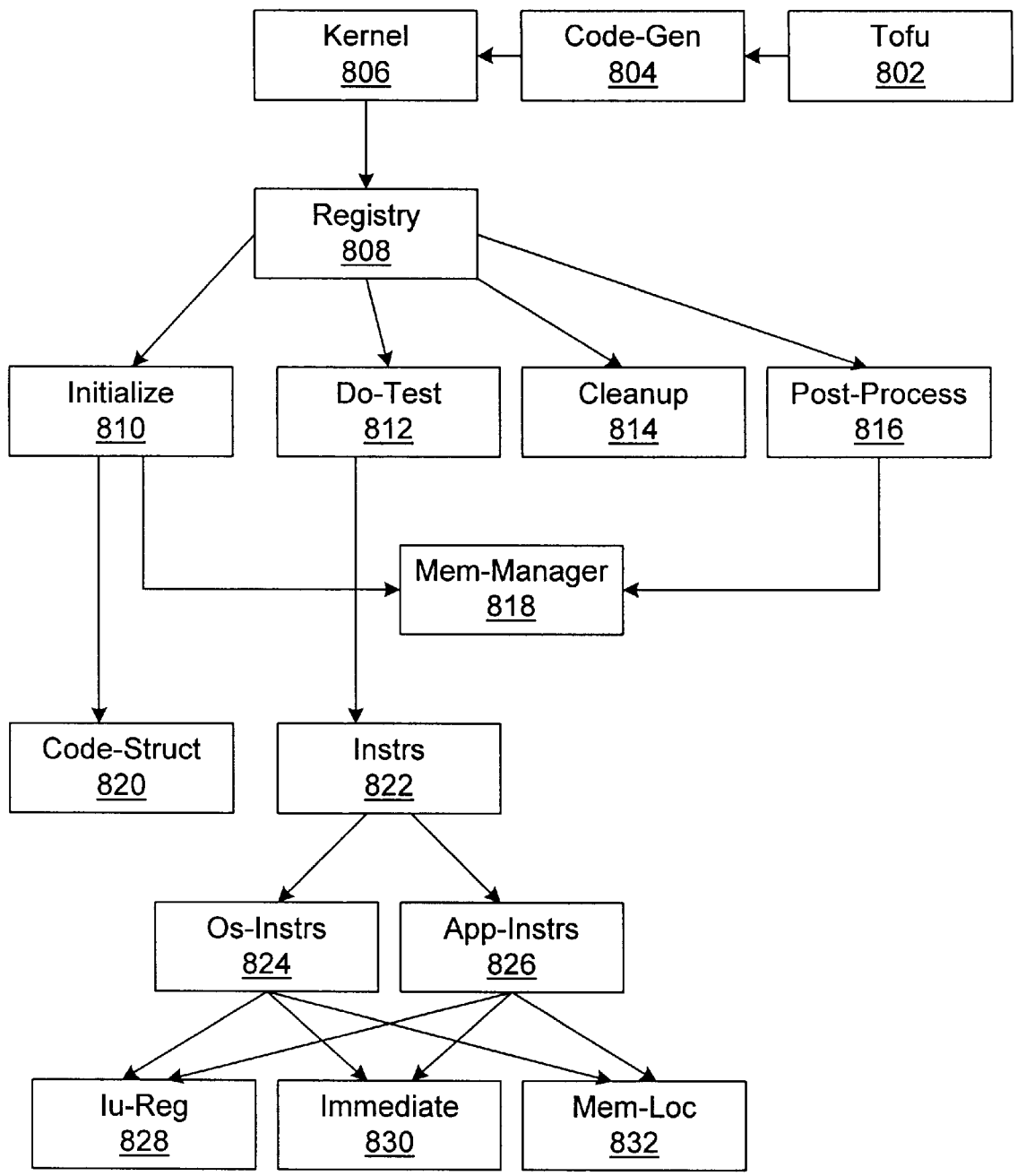
FIG. 8 is a block diagram illustrating the relationships between major objects of an example functional test generation engine.

FIG. 8 is a block diagram of the major CLOS objects of the functional test generation engine. These objects interact in order to generate functional tests. Each box represents a CLOS object in the object hierarchy. An arrow from one box to another represents a call from one object to another object. Each object will be described below along with the modules which include them.

The functional test generation engine includes three main modules: the KERNEL module, the DATA-LOC module, the RANDOM INSTRUCTION GENERATOR module. The KERNEL module is independent of microprocessor functionality and provides the framework under which functional tests are generated. In addition to providing key resources such as memory management and keeping track of the generated code, the KERNEL module contains a registry which tracks the presence of other modules. This registry allows the KERNEL module to: (i) initialize other modules as required, and (ii) maintain a list of available objects which may be called upon to generate functional tests.

The KERNEL module includes most of the objects shown in FIG. 8: a TOFU (Top OF Universe) object 802, a CODE-GEN object 804, a KERNEL object 806, a REGISTRY object 808, an INITIALIZE object 810, a DO-TEST object 812, a CLEANUP object 814, a POST-PROCESS object 816, a MEM-MANAGER object 818, and a CODE-STRUC object 820. The TOFU object 802 provides a common root from which the rest of the objects in the functional test generation engine descend. The CODE-GEN object 804 is a child of the TOFU object 802. The CODE-GEN object 804 defines two slots, a 'choices' slot and a 'priority' slot, along with a 'choose' method. The choices slot contains a list of choices available to a given object in the problem solver object hierarchy, and usually contains a list of the children of that object. The priority slot defines the relative priority (i.e., selection probability) of a given object with respect to its siblings. The choose method uses the priority values in the priority slot to perform a random selection between the choices listed in the choices slot. The choices slot, the priority slot, and the choose method are inherited by the rest of the objects in the functional test generation engine.

The KERNEL object 806 provides a common root from which the remaining objects in the functional test generation engine descend, including the REGISTRY object 808 and the MEM-MANAGER object 818. The REGISTRY object 808 maintains lists of objects that need to be involved at various stages of test code generation. The REGISTRY object 808 has four child objects to maintain each of the lists: the INITIALIZE object 810, the DO-TEST object 812, the CLEANUP object 814, and the POST-PROCESS object 816.

The INITIALIZE object 810 maintains a list of objects which need to be initialized before generating each test code file. Each object in the list is initialized by calling an 'initialize' method with the name of the object to be initialized as an argument. The DO-TEST object 812 is the root of the decision tree used to generate tests. Objects which can generate different classes of tests register themselves with the DO-TEST object 812. At each iteration of functional test code generation a random selection is made among the registered objects, and a call to a 'do-test' method is made with the selected object as an argument. The CLEANUP object 814 maintains a list of objects that need to be called to generate proper termination code at each possible exit point in the generated test pattern. When an exit point is reached during test code generation, a 'cleanup' method is called upon each object in the list.

The POST-PROCESS object 816 implements a post-processing code generation phase. Activities which could not be performed during the original code generation phase are performed during the post-processing phase. For example, memory allocation cannot occur until the size of each required block of memory has been determined, and paging iterations cannot be generated until the location of each of the pages in memory has been determined. All objects that need to be called during the post-processing phase register themselves with the POST-PROCESS object 816. At the time of registration, each object supplies the relative order in which the object needs to be called. Once test generation is complete, a 'post process post-process' method is called. The 'post process post-process' method calls each of the registered objects in the appropriate order, thus completing functional test code generation.

The MEM-MANAGER object 818 allocates memory during the post-processing phase. The CODE-STRUC object 820 keeps track of the generated blocks of code.

The RANDOM INSTRUCTION GENERATOR module is responsible for generating simple integer unit instruction tests. The RANDOM INSTRUCTION GENERATOR module is registered with the DO-TEST object 812 of the KERNEL module as a source of top level tests. The RANDOM INSTRUCTION GENERATOR module relies upon the DATA-LOC module to provide the resources it needs as operands for the instruction test.

The RANDOM INSTRUCTION GENERATOR module includes three of the objects shown in FIG. 8: an INSTRS object 822, an OS-INSTRS object 824, and an APP-INSTRS object 826. The INSTRS object 822 provides a framework for the generation of instruction tests. The children of the INSTRS object 822, the OS-INSTR object 824 and the APP-INSTRS object 826, break the set of available instructions into specific groups. The OS-INSTRS object 824 generates instruction tests for instructions executed by an operating system (e.g., privileged x86 instructions executed by an operating system at privilege level 0). The APP-INSTRS object 826 generates instructions executed by an application program (i.e., application instructions). For example, most x86 instructions are classified as application instructions, excluding those which are floating-point related, branch related, segmentation related, or intended for operating system use.

The DATA-LOC module generates various types of instruction operands, including immediate operands, register operands, memory operands, and I/O operands, for functional tests which require them. When a memory operand is selected, the DATA-LOC module is capable of generating complex addressing modes. The DATA-LOC module does not generate any tests itself, but it is responsible instead for satisfying requests for resources from other modules. The major types of resources the DATA-LOC module supplies includes integer registers, floating point registers, immediates, input/output (I/O) ports, and memory locations. Any module requiring one of these resources for a test simply requests that resource from the DATA-LOC module. Thus the DATA-LOC module allows other modules to increase their functional test coverage.

The DATA-LOC module includes three of the objects shown in FIG. 8: an IU-REG object 828, an IMMEDIATE object 830, and a MEM-LOC object 832. The IU-REGS object 828 generates integer register operands. The IMMEDIATE object 830 generates immediate operands. The MEM-LOC object 832 generates memory address operands.

The KERNEL, DATA-LOC, and RANDOM INSTRUCTION GENERATOR modules will now be described in detail, beginning with the KERNEL module. The KERNEL module also defines the CODE-GEN object 804 as a child of the TOFU object 802. The CODE-GEN object 804 defines certain properties which are inherited by the rest of the objects in the functional test generation engine. As described above, the CODE-GEN object 804 defines two slots, a 'choices' slot and a 'priority' slot, along with a 'choose' method. The two slots and the choose method are inherited by all other objects. The choices slot contains a list of the available choices at a given object in the problem solver object hierarchy, and usually contains a list of the children of that object. The priority slot defines the relative priority (i.e., selection probability) of a given object with respect to its siblings.

When the choose method is invoked in an object, a random selection is made from the list of candidates in that object's choices slot. Each candidate in the choices slot has a corresponding priority value in the priority slot. If there are 'n' candidates in the choices slot, and candidate 'j' has a corresponding priority value of $p_j$ in the priority slot, the probability that candidate 'j' will be selected at random, Ps, is:

$$Ps = \frac{p_j}{\sum_{i=1}^{n} p_i}$$

Thus the priority value associated with a given candidate is used to control how often the candidate is chosen. Setting the priority value to a larger number increases the relative probability that the given candidate will be selected. On the other hand, setting the priority value to 0 ensures that the given candidate will never be selected.

The choose method is utilized frequently to select among a set of candidates in the choices slot. Candidates may be, for example, instructions or alternate methods for generating a floating point number. An interface mechanism allows a user to set multipliers which increase or decrease priority values as needed. The priority values are preferably set to generate functional tests which exercise a wide range of the functionality of a microprocessor under test.

The KERNEL module includes functions required by all modules, including a memory management function. The memory manager (i.e., memory allocator) allows a functional test to use all of, or only selected portions of, the available memory space. Where the microprocessor under test include separate code and data caches, the memory allocator attempts to set up memory usage to cause many cache line replacements in both caches. The KERNEL module also generates random numerical values for both integer and floating point operations. When an argument is needed for an integer operation, the KERNEL module simply generates a random number of the appropriate size.

The memory manager of the KERNEL module ensures that the low bits of the addresses used are unique to the available memory space. For example, if the functional test generation engine is configured to use 256 kb of memory, all generated patterns would use 256 kb or less of total memory. The contiguous blocks (i.e., allocations) of memory used would be logically spread across the entire address space (e.g., 4 Gb), but would actually be placed such that the low 18 bits of every used address is unique in the available 256 kb of actual memory. A typical hardware platform which supports 256 kb of memory would be designed to decode only the low 18 bits of the address bus to allow tests which exercise all of the 4Gb test space to run in 256 kb without problems.

The memory manager decides which parts of the 4 Gb address space to use when it is initialized before each file is generated. Given a total amount of available memory M, it essentially starts by breaking the total available memory into contiguous blocks (i.e., memory blocks) the size of which are determined by internal parameters. Each contiguous block is then assigned for use at one of the possible 4 Gb/M aliases for that contiguous block. This generates the map of available memory.

As code for a file is generated, various "blocks" of code and data (i.e., code blocks) are dynamically created and are added to. As code and data definitions are generated, the memory manager keeps track of the approximate number of memory bytes used by each code block. When the total amount of memory used crosses a pre-set threshold, subsequent new code block generation is suppressed to keep from exceeding the available memory. Once all code generation has been completed, the code blocks of varying sizes are allocated into the available memory during the post-processing phase. This involves a multiple pass effort.

Memory allocation begins by selecting a cache index which the pattern will try to "hit" on and around. For each block of code, a random choice is made among the available memory blocks big enough to accommodate the code block. If possible, the code block is placed in the memory block such that it crosses an address which will hit on the chosen cache index. Failing this condition, the code block will be allocated at the beginning or end of the memory block.

If the code blocks being allocated are large relative to the available memory blocks, the above scheme sometimes causes too much fragmentation in available memory. Such fragmentation can cause memory allocations to fail to complete. In this event, the entire allocation process is restarted without attempting to hit the chosen cache index. If this fails as well, presumably due to the initial allocation being too fragmented, the entire pattern is regenerated from the beginning. If the entire allocation scheme fails twice in a row, the functional test generation engine terminates with the assumption that the chosen configuration is not suitable for proper test code generation.

When allocating 16-bit code blocks into high memory, the memory manager generates the appropriate linker information in the header of the file. This information is later used by the assembly script to achieve the desired result of linking the 16-bit code segments into the required address in high memory.

As code is generated by the functional test generation engine, it is stored in a dynamic structure in memory and is not printed out until the very end of the file generation sequence (i.e., after completion of the post-processing phase). The CODE-STRUC object 820 keeps track of the generated blocks of code. The code block structure has the form ((insertion-point.info.entries)). For a given code block (blk) the entries field ((cddr blk)) is a list of elements which can be one of several types. These include elements which represent a single line in the file defining code, data, or a comment, or multiple lines such as a descriptor definition, or verbatim code which gets put into the file "as is". An entry can also be another code block creating a hierarchical structure which allows the file to be logically broken into various sections where code can be added. A depth-first advance through the hierarchy defines the order in which blocks are produced.

The CODE-STRUC object 820 uses two slots to keep track of code blocks as they are generated. The top-blk slot ((slot-value code-struc top-blk)) contains the top level code block for the current file. All other code blocks are inserted as an entry somewhere in this block to create the hierarchy structure for the file being generated. Once code generation is complete, the function 'code-dump' is called on this top level code block to print out the assembly file text for the file being generated.

The current-blk slot of CODE-STRUC ((slot-value code-struc 'current-blk)) points to the code block that code is currently being generated into. Once the initialization phase is complete, this slot is set up to point to a code block whose insertion-point points to the end of the block. Subsequent 'do-test' iterations usually simply add test code to the bottom of this code block.

The KERNEL module also keeps track of assigned thread numbers and the thread count. At each iteration of code generation, the thread count is incremented, and all generated lines of code are tagged with that thread number in the form of a comment (e.g.: ";T54"). Lines of code and data with the same thread number can be identified as coming from the same 'do-test' iteration.

The REGISTRY object 808 of the KERNEL module maintains central lists of modules. When a module is loaded, the module registers itself in the REGISTRY object 808. This allows new modules to be added into the system without having to modify the KERNEL module. The functional test generation engine has several different registries, including the INITIALIZE object 810, the DO-TEST object 812, the CLEANUP object 814, and the POST-PROCESS object 816.

The registries described above make up the heart of the functional test generation engine. The internal top-level call to generate a file is (gen-file registry len) which is essentially defined as follows:

(defmethod gen-file ((self registry) len) (setf (slot-value code-struc 'test-len) len) (initialize initialize) (do-test do-test) (cleanup cleanup) (post-process post-process) (code-dump (slot-value code-struc 'top-blk))

The DATA-LOC module will now be described in detail. As described above, the DATA-LOC module generates various types of instruction operands for functional tests which require them. Requests for immediate operands, either integer or floating point, are passed on to the KERNEL module. Requests for I/O addresses will be satisfied by locations which cover the entire I/O space. Requests for integer registers will be satisfied by any of the available general purpose registers which will also be initialized with a random integer if necessary. The major exception is the extended stack pointer register 'ESP' which is reserved for use as the stack pointer. The DATA-LOC module maintains the stack and is capable of generating tests to switch the current stack to different logical addresses in memory.

The DATA-LOC module keeps track of the STATE of the floating point registers. It can return any one of the floating point registers when requested. The DATA-LOC module can also initialize a returned floating point register with a floating point random number obtained from the KERNEL module.

An important feature of the functional test generation engine is that it provides "fault visibility". The DATA-LOC module keeps track of both floating point registers and integer registers which contain the results of previous computations, and can use this information to decide when to save register contents to memory.

A major portion of verification space covered by the DATA-LOC module occurs during the accessing of memory locations. When asked for a memory location, the DATA-LOC module can generate the data definition either "in-line" or in one of several data blocks. In-line memory locations are generated within the code stream and cause contention for the memory location between the instruction and data caches. Given a w-way data cache, the DATA-LOC module will set up w+1 data blocks. The DATA-LOC module can generate the requested memory location in any one of these data blocks. Both of these schemes are designed to interact with the memory allocation methods to cause many cache line replacements along with data-accesses to an entire address space (e.g., 4 Gb).

Once a memory location has been defined, the DATA-LOC module can generate an access using any of the available addressing modes (both 16-bit and 32-bit modes). When an "interesting" memory address is required such as for a snoop or a debug breakpoint, DATA-LOC generates an address that points somewhere into any of the data blocks, the stack, or the current code stream.

The current STATE contains some information about the integer registers, including which of these registers are marked 'LOCKED' and 'ACTIVE'. Registers are LOCKED when they are selected for a particular use in a test sequence which requires them to be loaded with a specific value. Locking a register will not allow it to be selected for subsequent operations which might need to write to that register. All registers are 'UNLOCKED' at the end of each 'do-test' call.

Registers are marked as ACTIVE when the result of a tested operation is written into them. An ACTIVE register can be read or modified, but is saved to memory before any write operation which could destroy its contents is performed. ACTIVE registers are also periodically saved out to memory and are marked as 'INACTIVE' even if they are not needed by an immediate operation.

Once an addressing mode has been selected for a particular memory access, any required registers are loaded with appropriate values right before executing the instruction carrying out the memory access. Certain cases (e.g., DS:[ECX][ECX]) can require the target memory location to be aligned on specific boundaries. This requirement is handled when generating the data definition.

The RANDOM INSTRUCTION GENERATOR module will now be described in detail. The RANDOM INSTRUCTION GENERATOR module covers most of the instructions of the microprocessor under test. Instructions not covered involve branches, floating point operations, segmentation, mode switching, and debug breakpoints. This essentially leaves all integer instructions which do straight-forward operations on a destination location (register or memory), optionally using one or possibly two source operands. Undocumented instructions which fall into this set are also covered by the RANDOM INSTRUCTION GENERATOR module.

In addition to exercising all of the above instructions, the RANDOM INSTRUCTION GENERATOR module is also responsible for exercising all legal forms of each one of the instructions (i.e., all combinations and variations of registers, memory locations, and immediates that the instruction supports). This coverage is multiplied by the verification space coverage provided by the DATA-LOC module when the DATA-LOC module is supplying the resources used as arguments to the instruction tests.

The RANDOM INSTRUCTION GENERATOR module also tests a small amount of self-modifying code (SMC) functionality. Because the Phar Lap assembler does not support generating specific forms of certain instructions having alternate forms, instructions with similar encoding are generated and are self-modified by the code stream to generate the target instruction. Sometimes this self-modification is done well before the target instruction executes, and in other cases, the modification happens just before the target instruction executes. In the case of an x86 microprocessor under test, if 486-style compatibility is required, a branch instruction can be forced between the modifying code and the target instruction.

If x86 instructions with LOCK prefixes are generated, a label is inserted between the LOCK prefix and the rest of the instruction. This label can be used as a target of a branch instruction to cause the target code to be re-interpreted without the consideration of the LOCK prefix.

The RANDOM INSTRUCTION GENERATOR module creates a large object hierarchy which exists under an INSTR-CLASSES object. The INSTR-CLASSES object has four sub-hierarchies defined under it which makes up the RANDOM INSTRUCTION GENERATOR module mechanism: the INSTRS object 822, an INSTR-TYPES object, an INSTR-FMTS object, and an INSTR-FIXUP object.

The INSTRS object 822 is the object from the RANDOM INSTRUCTION GENERATOR module which is registered with the DO-TEST object 812 in the KERNEL module. Under the INSTRS object 822 is a hierarchy representing all of the available x86 instructions that can be tested directly. Instructions supported by the RANDOM INSTRUCTION GENERATOR module which are executed by an operating system are organized under the OS-INSTR object 824. Other instructions (i.e., application instructions) fall under the APP-INSTRS object 826.

When the DO-TEST object 812 calls the INSTRS object 822 to generate a top level test, '(choose instrs)' is called to make a weighted random advance through the object hierarchy under the INSTRS object 822 and to select an object from which no arc extends to another object (i.e., a "leaf object"). Such leaf objects represent specific x86 instructions. The relative priorities down the object hierarchy can be controlled by the user interface to allow user control of the frequency with which different instructions are generated.

Once an instruction has been selected, a particular format for that instruction must be chosen. Because many x86 instructions share the same set of formats (e.g.: 'add', 'sub', 'and', and 'or' instructions all support the same set of instruction formats), these sets are defined as shared resources under the INSTR-TYPES object. The objects under the INSTR-TYPES object define types or classes of instructions which all support the same set of instruction formats. Each of these objects has access to a list of the instruction formats that type of instruction supports. The list is defined under the INSTR-FMTS object (described below). Each leaf object under the INSTRS object has associated with it the object under INSTR-TYPES that represents its instruction type. The choose method is then called on this object to select which format should be used for the instruction.

The hierarchy under the INSTR-FMTS object defines all the instruction formats supported by the x86 definition. Once an instruction and its format have been chosen, control is passed to the appropriate object under INSTR-FMTS. This object maintains a record of the types of destination and source resources required by the instruction format. The INSTR-FMTS object will call the DATA-LOC module to set up those resources and then generate the code to execute the selected instruction test. If the destination of the instruction test is a register, the test ends with a call to Data-Loc which might optionally cause the register to be written out to a unique location in memory.

Certain x86 instruction formats are not supported by the Phar Lap assembler. These instructions have multiple forms, of which only one is generated by the assembler. In order to generate the missing formats, the RANDOM INSTRUCTION GENERATOR module generates the closest possible encoding of the instruction that the assembler does support, then self-modifies that instruction to generate the required encoding.

The above mechanism is handled by the INSTR-FIXUP object which can cause code modification to take place in one of two possible locations. The modifying instruction is generated either near the beginning of the code stream so that the modification happens well before the target instruction executes. Alternately, the modifying instruction is generated just before the target instruction in the code stream so that modification and execution happens in sequence. If, as occurs in the 486 microprocessor, a branch is required between the modifying instruction and its target, the branch instruction is generated by the INSTR-FIXUP object as well.

Although most instruction tests are generated under the mechanism described above, certain instructions have special formats that are handled separately. For example, x86 LOCK prefix instructions generate a label between the LOCK prefix and the rest of the instruction. This label can be used as a target for a BRANCH instruction to cause a certain amount of code re-interpretation. Another example is the REP string operations which set up blocks of memory upon which to perform string operations.

It will be appreciated by those skilled in the art having the benefit of this disclosure that this invention is believed to be capable of generating and executing large numbers of functional tests for complex digital electronic systems at low cost. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of verifying proper functional operation of a digital electronic system, comprising the steps of:

generating a functional test using a decision tree representation of a verification space derived from a functional specification of the digital electronic system;

applying the functional test to a device under test, said device under test configured to produce a response;

applying the functional test to a golden device, said golden device configured to produce a response;

comparing the response produced by the device under test to the response produced by the golden device; and producing a functional test result based on the comparison of the response produced by the device under test and the response produced by the golden device.

2. The method as recited in claim 1, wherein said decision tree representation includes an initial goal node, a leaf goal node, and at least one intermediate goal node interconnected by a plurality of directed decision arcs formed between the initial goal node and the leaf goal node.

3. The method as recited in claim 2, wherein said generating comprises:

assigning a goal plan to said initial goal node, said leaf goal node, and said at least one intermediate goal node, wherein each goal plan comprises at least one operation; and executing the goal plan assigned to said initial goal node.

4. The method as recited in claim 3, further comprising the step of assigning a decision weight to each intermediate goal note and the leaf goal node, wherein said assigning occurs prior to said executing.

5. The method as recited in claim 4, wherein the at least one operation of the goal plan assigned to the initial goal node and each intermediate goal node comprises:

choosing a goal node directed to by a directed decision arc emanating from the current goal node at random and according to decision weights assigned to all goal nodes directed to by directed decision arcs emanating from the current goal node; and executing the goal plan assigned to the chosen goal node.

6. A method of verifying proper functional operation of a digital electronic system, comprising:

generating a functional test using a decision tree representation of a verification space derived from a functional specification of the digital electronic system, wherein said decision tree representation includes an initial goal node, a leaf goal node, and at least one intermediate goal node interconnected by a plurality of directed decision arcs formed between the initial goal node and the leaf goal node, and wherein said generating comprises:

assigning a goal plan to said initial goal node, said leaf goal node, and said at least one intermediate goal node, wherein each goal plan comprises at least one operation; and executing the goal plan assigned to said initial goal node;

applying the functional test to a device under test, said device under test configured to produce a first response; and producing a functional test result dependent upon said first response.

7. The method as recited in claim 6, further comprising the step of assigning a decision weight to each intermediate goal node and the leaf goal node, wherein said assigning occurs prior to said executing.

8. The method as recited in claim 7, wherein the at least one operation of the goal plan assigned to the initial goal node and each intermediate goal node comprises:

choosing a goal node directed to by a directed decision arc emanating from the current goal node at random and according to decision weights assigned to all goal nodes directed to by directed decision arcs emanating from the current goal node; and executing the goal plan assigned to the chosen goal node.

9. The method as recited in claim 6, further comprising:

applying the functional test to a golden device, said golden device configured to produce a second response; and comparing said first and second responses.

10. The method as recited in claim 9, wherein said functional test result is produced dependent upon the comparison of the first and second responses.

* * * * *